(12) United States Patent
Park et al.

(10) Patent No.: US 7,981,706 B2
(45) Date of Patent: Jul. 19, 2011

(54) PHOTORESIST COMPOSITION AND METHOD OF MANUFACTURING A DISPLAY SUBSTRATE USING THE SAME

(75) Inventors: Jeong-Min Park, Seoul (KR); Jung-Soo Lee, Seoul (KR); Won-Young Chang, Iksan-si (KR); Eun-Sang Lee, Daejeon (KR); In-Ho Yu, Iksan-si (KR); Seong-Hyeon Kim, Jeonju-si (KR)

(73) Assignees: Samsung Electronics Co., Ltd. (KR); Dongwoo Fine-Chem (KR)

( * ) Notice: Subject to any disclaimer, the term of this patent is extended or adjusted under 35 U.S.C. 154(b) by 0 days.

(21) Appl. No.: 12/891,940

(22) Filed: Sep. 28, 2010

(65) Prior Publication Data

US 2011/0097835 A1    Apr. 28, 2011

(30) Foreign Application Priority Data

Oct. 27, 2009    (KR) .............................. 2009-0101988

(51) Int. Cl.
*H01L 21/00* (2006.01)
(52) U.S. Cl. ............ 438/30; 438/34; 438/586; 438/780; 438/948; 257/E21.002; 257/E21.259; 257/E21.492; 257/E31.104
(58) Field of Classification Search ..................... 438/30, 438/34, 586, 780, 948, FOR. 473; 428/1.23; 349/124; 430/311; 427/385.5, 96.1; 257/E21.002, 257/E21.259, E21.492, E31.104
See application file for complete search history.

(56) References Cited

U.S. PATENT DOCUMENTS

| 6,045,977 A * | 4/2000 | Chandross et al. ........... 430/311 |
| 2008/0254634 A1* | 10/2008 | Park et al. ..................... 438/703 |
| 2010/0009482 A1* | 1/2010 | Park et al. ..................... 438/34 |

* cited by examiner

*Primary Examiner* — Michelle Estrada
(74) *Attorney, Agent, or Firm* — Cantor Colburn LLP

(57) ABSTRACT

A photoresist composition includes an alkali-soluble resin, a dissolution inhibitor including a quinone diazide compound, a first additive including a benzenol compound represented by the following Chemical Formula 1, a second additive including an acrylic copolymer represented by the following Chemical Formula 2 and an organic solvent. Accordingly, heat resistance of a photoresist pattern may be improved, and the photoresist pattern may be readily stripped. As a result, crack formation in the photoresist pattern may be reduced and/or prevented.

Chemical Formula 1

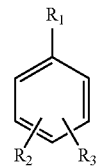

Chemical Formula 2

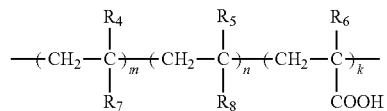

20 Claims, 4 Drawing Sheets

PHOTORESIST COMPOSITION AND METHOD OF MANUFACTURING A DISPLAY SUBSTRATE USING THE SAME

This application claims priority to Korean Patent Applications No. 2009-101988, filed on Oct. 27, 2009, and all the benefits accruing therefrom under 35 U.S.C. §119, the contents of which are herein incorporated by reference in their entirety.

BACKGROUND OF THE INVENTION

1. Field of the Invention

This application relates to a photoresist composition and a method of manufacturing a display substrate using the photoresist composition. More particularly, this application relates to a photoresist composition that may be used for a display device, and a method of manufacturing a display substrate using the photoresist composition.

2. Description of the Related Art

In general, a liquid crystal display ("LCD") panel includes a display substrate, an opposing substrate facing the display substrate and a liquid crystal layer interposed between the display substrate and the opposing substrate. The display substrate includes a gate pattern, a semiconductor pattern, a source pattern and a pixel electrode, which are formed sequentially on a base substrate. The gate pattern, the semiconductor pattern, the source pattern and the pixel electrode may be formed by patterning thin-film layers by a photolithography process.

Two different layers that are patterned by using two masks through a conventional method may also be patterned by using a single mask. For example, photoresist patterns having different thicknesses are formed on a first thin-film layer and a second thin-film layer, which are in turn sequentially formed. Thereafter, the first and second thin-film layers are patterned by etching, using the photoresist pattern as a mask. After patterning the first thin-film layer, a portion of the photoresist pattern is removed to form a remaining pattern, and the second thin-film layer is patterned by using the remaining pattern as a mask. In this way, the number of masks required may be reduced, thereby reducing the cost associated with the expense of using multiple masks.

However, when the second thin-film layer is patterned using the remaining pattern as a mask, the remaining pattern can be damaged by the etchant used to pattern the second thin-film layer, or may undergo reflow and thus loss of resolution or pattern collapse. As a result, the second thin-film layer may be more highly etched when compared to the first thin-film layer so that the first thin-film layer has a shape which protrudes through the second thin-film layer. When the second thin-film layer is a source metal layer and the first thin-film layer is a silicon layer, the second thin-film layer which substantially serves as an electrode or a signal line may have a smaller size than the first thin-film layer. Thus, the ratio of the sizes of openings in a display substrate may be reduced.

Accordingly, a photoresist pattern needs to have a high heat resistance in order to form a fine photoresist pattern. Furthermore, it is required that no cracks are generated at the surface of the photoresist pattern at a low temperature or by a chemical material, and that the photoresist pattern be readily removed by a stripper. However, when heat resistance of a photoresist pattern is enhanced, the photoresist pattern may not be readily removed by a stripper. Furthermore, when the manufacturing (processing) temperature is reduced so as to remove a photoresist pattern easily, cracks may be generated.

Thus, there increasing need to develop a photoresist composition capable of solving those problems.

BRIEF SUMMARY OF THE INVENTION

In an embodiment, a photoresist composition capable of improving a reliability of a photoresist pattern is provided.

In another embodiment, a method of manufacturing a display substrate using the above-mentioned photoresist composition is provided.

A photoresist composition. according to an exemplary embodiment, includes an alkali-soluble resin, a dissolution inhibitor including a quinone diazide compound, a first additive including a benzenol compound represented by the following Chemical Formula 1, a second additive including an acrylic copolymer represented by the following Chemical Formula 2, and an organic solvent.

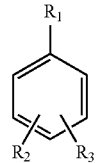

Chemical Formula 1

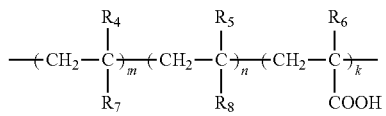

Chemical Formula 2

In Chemical Formulas 1 and 2, $R_1$, $R_2$ and $R_3$ each independently represents a hydrogen atom, an alkyl group having 1 to 10 carbon atoms, or a hydroxyalkyl group having 1 to 10 carbon atoms; at least one of $R_1$, $R_2$ and $R_3$ represents a hydroxy group, and $R_4$, $R_5$ and $R_6$ each independently represents a hydrogen atom or an alkyl group having 1 to 3 carbon atoms; $R_7$ represents a hydrocarbon having 1 to 6 carbon atoms, of which at least one hydrogen atom is replaceable with a substituent, and $R_8$ represents a benzyl group or a phenyl group, and m, n, and k are each independently an integer of 1 to 99 in which the sum of m, n and k is 100.

The alkali-soluble resin may include a fractionated novolac resin.

A glass transition temperature of the fractionated novolac resin may be about 120° C. to about 150° C.

A weight average molecular weight of the fractionated novolac resin may be about 20,000 to about 30,000 g/mol.

The photoresist composition includes about 10% to about 25% by weight of the alkali-soluble resin, about 1% to about 10% by weight of the dissolution inhibitor, about 0.1% to about 10% by weight of the first additive, about 0.1% to about 10% by weight of the second additive and a balance of the solvent. The photoresist composition includes an alkali-soluble resin, a dissolution inhibitor including a quinone diazide compound, a first additive including a benzenol compound represented by the Chemical Formula 1, a second additive including an acrylic copolymer represented by the Chemical Formula 2 and an organic solvent. The source metal layer is patterned by with the photoresist pattern as an etching mask to form a source pattern and an active pattern. The source pattern includes a data line, a source electrode and a drain electrode. The active pattern is formed under the source and drain electrodes, and a pixel electrode electrically connected to the drain electrode is formed on the base substrate having the source pattern and the active pattern According to another embodiment, there is provided a method of manufacturing a display substrate. In the method, a gate pattern including a gate line and a gate electrode is sequentially formed on a surface of a base substrate to form a multilayer stack. A gate insulation layer, a semiconductor layer, an ohmic contact layer and a source metal layer are thus sequentially formed on a surface of the base substrate having the gate pattern to form the multilayer stack. A photoresist composition is coated on the surface of the base substrate having the source metal layer to form a photoresist pattern.

The photoresist pattern may include a first thickness portion having a first thickness and overlapping with the source pattern, and a second thickness portion having a second thickness smaller the first thickness and overlapping with a gap between the source electrode and the drain electrode.

The photoresist pattern may be heated at a temperature of about 140° C. to about 150° C. A shape of the photoresist pattern prior to heating may be substantially the same as a shape of the photoresist pattern after heating.

In another embodiment, a heat resistance of a photoresist pattern may be improved, and the photoresist pattern may be readily stripped. Furthermore, crack formation in the photoresist pattern may be reduced and/or prevented.

In another embodiment, a method of forming a pattern using the photoresist composition may include forming a photoresist film on a substrate to be patterned from the photoresist composition, exposing the photoresist film, developing the exposed photoresist film to form a patterned photoresist, and etching the substrate to form a pattern. The patterned photoresist prepared from the photoresist composition does not exhibit crack formation at a processing temperature of less than about 120° C. or in the presence of an etching solution.

BRIEF DESCRIPTION OF THE DRAWINGS

The above and other features and advantages of the present invention will become more apparent by describing in detailed exemplary embodiments thereof with reference to the accompanying drawings, in which.

DETAILED DESCRIPTION OF THE INVENTION

Figure 1:
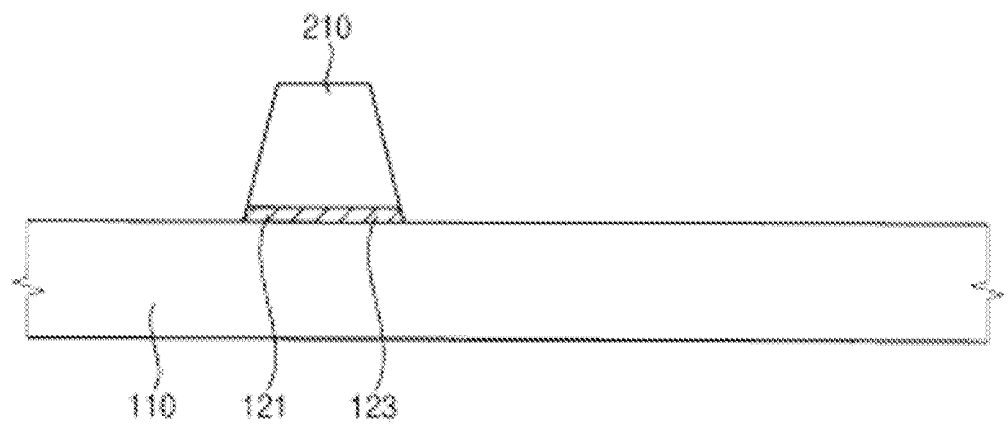
FIG. 1 is a cross sectional view illustrating a display device according to an exemplary embodiment.

The embodiments are described more fully hereinafter with reference to the accompanying drawings, in which exemplary embodiments of the invention are shown. The invention may, however, be embodied in many different forms and should not be construed as limited to the exemplary embodiments set fourth herein. Rather, these exemplary embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, the elements are in at least partial contact with each other and there are no intervening elements or layers present. Like numerals refer to like elements throughout. As used herein, the term "and/or" includes any and all combinations of one or more of the associated listed items.

It will be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the apparatus in use or operation in addition to the orientation depicted in the figures. For example, if the apparatus in the figures is turned over, elements described as "lower" other elements or features would then be oriented "upper" the other elements or features. Thus, the exemplary term "lower" can encompass both an orientation of above and below. The apparatus may be otherwise oriented (rotated 90 degrees or at other orientations) and the spatially relative descriptors used herein interpreted accordingly.

The terminology used herein is for the purpose of describing particular exemplary embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross sectional illustrations that are schematic illustrations of idealized embodiments (and intermediate structures). As such, variations from the shapes of the illustrations as a result, for example, of manufacturing techniques and/or tolerances, are to be expected. Thus, exemplary embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of an apparatus and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Also herein, the term "about," where used to describe the endpoint of a range, will be understood to imply the intrinsic error in determining the range endpoints, and will be limited to be no greater than currently accepted measurement error according to capabilities commonly found in the art unless otherwise defined. For example, where a compositional range is disclosed, the term "about" may define the error intrinsic to measurement of mass using, for example, a balance or load cell as would be routinely used by the skilled practitioner, or where a temperature range is disclosed, the term "about" may define the error intrinsic to temperature measurements that would be routinely used by the skilled practitioner.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Photoresist Composition

A photoresist composition according to an embodiment includes a) an alkali-soluble resin, b) a dissolution inhibitor, c) a first additive, d) a second additive and e) an organic solvent.

(a) Alkali-Soluble Resin

The alkali-soluble resin includes a fractionated novolac resin. The fractionated novolac resin may be defined as a resin which occupies middle molecular weight region of the molecular weight distribution (referred to sometimes as the "polymer molecular weight distribution") which is obtained by fractionating a synthesized resin and excluding the polymeric components forming the high molecular weight region and the monomeric or low molecular weight components forming the low molecular weight region. "Molecular weight region" and "polymer molecular weight distribution" may refer to either regions or the entirety of the weight average molecular weight distribution, or the number average molecular weight distribution, and fractions taken from these distributions. Hereinafter, the "fractionated novolac resin" will refer to a middle molecular weight fraction based on weight average molecular weight for the novolac resin, unless otherwise noted.

The fractionated novolac resin is obtained by an addition-condensation reaction of a phenol compound with an aldehyde compound or a ketone compound. A condensation product obtained by the addition-condensation reaction is then fractionated and cut to exclude a high molecular weight region and a low molecular weight region to prepare the fractionated novolac resin. Examples of methods of fractionating may include selective washing of the alkali-soluble resin using solvents or solvent combinations in which the alkali-soluble resin is partially soluble, precipitation by dissolving the alkali-soluble resin in a solvent, and precipitation from a non-solvent miscible with the solvent, and/or preparative scale size exclusion chromatography in which the desired molecular weight fractions are collected upon elution, combined, and the fractionated polymer isolated by precipitation or removal of the elution solvent.

Examples of the phenol compound may include phenol, ortho-cresol, meta-cresol, para-cresol, 2,5-xylenol, 3,5-xylenol, 3,4-xylenol, 2,3,4-trimethylphenol, 4-t-butylphenol, 2-t-butylphenol, 3-t-butylphenol, 3-ethylphenol, 2-ethylphenol, 4-ethylphenol, 3,3-methyl-6-t-butylphenol, 4-methyl-2-t-butylphenol, 2-naphthol, 1,3-dihydroxynaphthalene, 1,7-dihydroxynaphthalene, 1,5-dihydroxynaphthalene, and the like. These phenol compounds may be used alone or in a combination thereof.

Examples of the aldehyde compound may include formaldehyde, paraformaldehyde, acetaldehyde, propionaldehyde, benzaldehyde, alpha-phenylpropionaldehyde, beta-phenylpropionaldehyde, ortho-hydroxybenzaldehyde (salicylaldehyde), meta-hydroxybenzaldehyde, para-hydroxybenzaldehyde, glutaraldehyde, glyoxal, ortho-methylbenzaldehyde, para-methylbenzaldehyde, and the like. These aldehyde compounds may be used alone or in a combination thereof.

Examples of the ketone compound may include acetone, methylethylketone, diethylketone, methyphenylketone (acetophenone), diphenylketone, and the like. These may be used each alone or in a combination thereof.

The addition-condensation reaction of a phenol compound with an aldehyde compound or a ketone compound may be performed in the presence of an acid catalyst. For example, the addition-condensation reaction may be performed at a temperature of about 60° C. to about 250° C. for about 2 hours to about 30 hours. Examples of the acid catalyst may include an organic acid such as oxalic acid, formic acid, trichloroacetic acid, para-toluenesulfonic acid and the like, an inorganic acid such as hydrochloric acid, sulfuric acid, perchloric acid, phosphoric acid, and the like, and a bivalent metal salt such as acetic acid zinc salt, acetic acid magnesium salt, and the like. Combinations of these acid catalysts may also be used.

When the weight average molecular weight of the fractionated novolac resin is less than 20,000 g/mol, the fractionated novolac resin may be too readily dissolved by an alkali solution of developer, thereby causing damage to the pattern being formed such as undercut, loss of profile/rounding, or other artifacts. When a weight average molecular weight of the fractionated novolac resin is more than 30,000 g/mol, the difference in solubility of a photoresist film between an exposed region and a non-exposed region is reduced so that contrast is reduced, and higher resolution fine photoresist patterns do not form cleanly. Thus, the weight average molecular weight of the fractionated novolac resin may be about 20,000 to about 30,000 g/mol, specifically about 21,000 to about 29,000 g/mol, and still more specifically about 22,500 to about 27,500 g/mol. The fractionated novolac resin has a narrow polydispersity of less than or equal to about 3, specifically less than or equal to about 2.5, and more specifically less than or equal to about 2.

The glass transition temperature ($T_g$) of the fractionated novolac resin may be about 120° C. to about 150° C. The $T_g$ of the fractionated novolac resin is thus selected such that, a photoresist pattern formed from the photoresist composition and including the fractionated novolac resin does not deform at a thermal processing temperature of about 120° C. to about 140° C. for the photoresist pattern. Therefore, the photoresist pattern formed from the photoresist composition may have a high heat resistance, i.e., resistance to thermal deformation at a temperature higher than 150° C., thereby preventing deformation of the photoresist pattern.

When the content of the fractionated novolac resin is less than about 10% by weight based on the total weight of the photoresist composition, the heat resistance of a photoresist pattern is reduced so that the photoresist pattern is readily deformed in a heat-treating process. When the content of the fractionated novolac resin is more than 15% by weight, the photoresist pattern may be resistant to a subsequent stripping process, and cracking of the photoresist pattern may occur. Thus, the content of the fractionated novolac resin may be about 10% to about 25%, specifically about 12% to about 23%, and still more specifically about 15% to about 20% by weight, based on the total weight of the photoresist composition.

The alkali-soluble resin may include a single fractionated novolac resin or a combination of different fractionated novolac resins. In an embodiment, a single fractionated resin may be used were, for example, the fractionated novolac resin may be prepared by reacting a phenol compound including m-cresol and p-cresol in a weight ratio of 40:60 to 60:40 with formaldehyde, and fractionating the reaction product. In another embodiment where a combination of fractionated novolac resins is used, the alkali-soluble resin may include, for example, a first fractionated novolac resin and a second fractionated novolac resin. The first fractionated novolac resin may be prepared by reacting a phenol compound including m-cresol and p-cresol in a weight ratio of 60:40 with formaldehyde and by fractionating the reaction product, and may have a weight average molecular weight of about 20,000 g/mol. The second fractionated novolac resin may be prepared by reacting a phenol compound including m-cresol and p-cresol in a weight ratio of 50:50 with formaldehyde and by fractionating the reaction product, and may have a weight average molecular weight of about 20,000 g/mol.

(b) Dissolution Inhibitor

The dissolution inhibitor includes a quinone diazide compound. The dissolution inhibitor may include, for example, a quinone diazide sulfonic acid ester compound, sometimes referred to in the art as a diazonaphthoquinone ("DNQ") compound. The quinone diazide sulfonic acid ester compound may be prepared by a reaction of a phenol compound (sometimes referred to in the art as a "backbone") having a hydroxyl group and a quinone diazide sulfonic acid halide compound.

Examples of the phenol compound having a hydroxyl group may include 2,3,4-trihydroxybenzophenone, 2,4,6-trihydroxybenzophenone, 2,3,4,3'-tetrahydroxybenzophenone, 2,3,4,4'-tetrahydroxybenzophenone, tri(p-hydroxyphenyl)methane, 1,1,1-tri(p-hydroxyphenyl)ethane, 4,4'-[1-[4-[1-[4-hydroxyphenyl]-1-methylethyl]phenyl]ethylidene]diphenol, and the like. The phenol compounds may be used alone or in a combination thereof.

Examples of the quinone diazide sulfonic acid halide compound may include 1,2-naphthoquinonediazide-5-sulfonic acid chloride, 1,2-naphthoquinonediazide-4-sulfonic acid chloride, 1,2-benzoquinonediazide-4-sulfonic acid chloride, o-quinonediazide sulfonyl chloride, and the like. The quinone diazide sulfonic acid halide compounds may be used alone or in a combination thereof.

The quinone diazide compound may be prepared by reacting, in an exemplary embodiment, 2,3,4-trihydroxybenzophenone with o-quinonediazide sulfonyl chloride in the presence of a base such as triethylamine and separating an obtained product through a following process. The molar amounts of phenol compound and quinone diazide sulfonic acid halide compound may be selected to prepare quinone diazide compounds in which the ratio of DNQ to backbone is 1:1 or less based on the number of hydroxy groups on the backbone; for example, where 2,3,4-trihydroxybenzophenone is condensed with o-quinonediazide sulfonyl chloride, the molar ratio of these components in the condensed quinone diazide compound is 1:1, 1:2, or 1:3, or an averaged combination of these, depending on the charge. In the following process, the intermediate product may react with water to precipitate the isolated product, which may then be collected by filtration and dried to provide the isolated product as a powder, in the solid phase. Alternatively, the intermediate product may be treated with a resist solution or solvent such as, for example, a solution including 2-heptanone, rinsed with water, and phase separated, and the solvent removed by distillation or equilibrium flash distillation. As a result, the product may be obtained in the liquid phase in a resist solution. The equilibrium flash distillation is a continuous distillation. According to the equilibrium flash distillation, a portion of a liquid mixture is distilled, and a vapor obtained thereby makes contact with the liquid. When equilibrium between the obtained vapor and the liquid is reached, the liquid and vapor are separated.

When the content of the dissolution inhibitor is less than about 1% by weight based on the total weight of the photoresist composition, the content of dissolution inhibitor may be insufficient to prevent dissolution of the fractionated novolac resin by the alkali developing solution. When the content of the dissolution inhibitor is more than about 10%, the fractionated novolac resin may not be soluble in the alkali developing solution and may not form a photoresist pattern. Therefore, the content of the dissolution inhibitor may be about 1% to about 10%, specifically about 2 to about 8%, and still more specifically about 3 to about 7% by weight based on the total weight of the photoresist composition.

(c) First Additive

The first additive includes a benzenol compound represented by the following Chemical Formula 1.

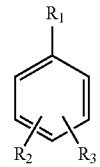

Chemical Formula 1

In Chemical Formula 1, $R_1$, $R_2$ and $R_3$ each independently represent a hydrogen atom, an alkyl group having 1 to 10 carbon atoms, or an alkyl hydroxyl group having 1 to 10 carbon atoms, where at least one of $R_1$, $R_2$ and $R_3$ represents a hydroxyl group. The alkyl group may be a linear or branched alkyl group. Exemplary alkyl groups include methyl, ethyl, n-propyl, isopropyl, 1- or 2-butyl, isobutyl, t-butyl, 1-, 2-, or 3-pentyl, 1,1- or 2,2-dimethylpropyl, 2-methylbutyl, 3-methylbutyl, 1-, 2-, 3-hexyl, 1,1-, 2,2-, or 3,3-dimethylbutyl, 1,2-, 1,3-, or 2,3-dimethylbutyl, 2-methylbutyl, 3-methylbutyl, n-octyl, 3-octyl, 1,1,3,3-tetramethylbutyl, n-decyl, cyclopentyl, 1-methylcyclopentyl, cyclohexyl, 2-methoxyethyl, 2-ethoxyethyl, 2-methoxypropyl, 2-ethoxypropyl, or the like. Combinations of these groups may be used. Additionally, the alkyl hydroxyl group may be a linear or branched hydroxyalkyl group. Exemplary hydroxyalkyl groups may include 2-hydroxyethyl, 2-hydroxypropyl, 2,3-dihydroxypropyl, 2-hydroxybutyl, 4-hydroxybutyl, 2,3-dihydroxybutyl, 2-hydroxypentyl, 2-hydroxyhexyl, hydroxycyclohexyl, methylhydroxycyclohexyl, 2,3- or 2,4-dihydroxymethyl, hydroxymethylcyclohexyl, inosityl, 2-(2- hydroxyethoxy)ethyl, 2-(2-(2-hydroxyethoxy)ethoxy)ethyl, and the like. Combinations of these groups may be used.

The first additive enhances the interaction between the fractionated novolac resin and the alkali developing solution capable of dissolving the fractionated novolac resin. While not wishing to be bound by theory, it is believed that this enhancement occurs because of the interaction by hydrogen bonding of compatible functional groups (e.g., phenolic hydroxy groups) present on the fractionated novolac and the first additive, which may reduce the pKa of some of the base-soluble phenol hydroxy groups on the fractionated novolac and thereby enhance base solubility of the fractionated novolac. Further, a stripping solution that is hydrophilic may readily penetrate between the photoresist pattern and a lower layer formed under the photoresist pattern. Thus, the photoresist pattern formed from the photoresist composition may be readily stripped.

When a content of the first additive is less than 0.1% by weight based on the total weight of the photoresist composition, the interaction between the fractionated novolac resin and the alkali developing solution may not occur and dissolution in alkali developer solution may not be enhanced. Thus, the photoresist pattern may not be sufficiently removed to clear the pattern. When a content of the first additive is more than 10% by weight, the heat resistance of the photoresist pattern may be reduced. Thus, a content of the first additive the may be about 0.1% to about 10%, and specifically about 0.1% to about 5% by weight based on the total weight of the photoresist composition.

(d) Second Additive

The second additive includes an acryl copolymer represented by the following Chemical Formula 2.

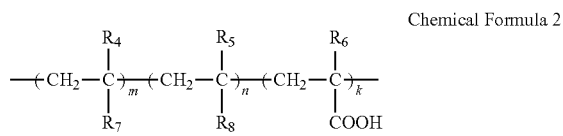

Chemical Formula 2

In Chemical Formula 2, $R_4$, $R_5$ and $R_6$ each independently represents a hydrogen atom or an alkyl group having 1 to 3 carbon atoms, $R_7$ represents a hydrocarbon having 1 to 6 carbon atoms, of which at least one hydrogen atom is replaceable by a substituent, $R_8$ represents a substituted or unsubstituted benzyl group or phenyl group, and m, n, and k independently represent an integer of 1 to 99 such that the sum of m, n and k is 100. Exemplary alkyl groups having 1 to 3 carbon atoms for $R_4$ to $R_6$ include methyl, ethyl, n-propyl, isopropyl, 2-methoxyethyl, or the like, or a combination of these. Exemplary alkyl groups having 1 to 6 carbon atoms for $R_7$ include methyl, ethyl, n-propyl, isopropyl, f- or 2-butyl, isobutyl, t-butyl, 1-, 2-, or 3-pentyl, 1,1- or 2,2-dimethylpropyl, 2-methylbutyl, 3-methylbutyl, 1-, 2-, 3-hexyl, 1,1-, 2,2-, or 3,3-dimethylbutyl, 1,2-, 1,3-, or 2,3-dimethylbutyl, 2-methylbutyl, 3-methylbutyl, cyclopentyl, 1-methylcyclopentyl, cyclohexyl, 1-methylcyclohexyl, 2-methoxyethyl, 2-ethoxyethyl, 2-methoxypropyl, 2-ethoxypropyl, or the like, or a combination of these. The hydrogen atom of the hydrocarbon replaceable in $R_7$ may be substituted for an alkyl group, and specifically an alkyl group having 1 to 10 carbon atoms, a hydroxyalkyl group, and specifically a hydroxyalkyl group having 1 to 10 carbon atoms, a alkoxy group and specifically an alkoxy group having 1 to 10 carbon atoms, or a cycloalkyl group having 3 to 6 carbon atoms, including both cycloalkyl and heterocycloalkyl groups including a heteroatom such as oxygen, nitrogen, silicon, or the like.

While not wishing to be bound by theory, the second additive may minimize the inner stress of a photoresist pattern, which may in turn be caused by diffusion into the photoresist pattern of an etching solution, including nitric acid of high concentration for etching a lower layer formed under the photoresist pattern, thereby preventing crack formation at the surface of the photoresist pattern. Furthermore, the second additive may prevent crack formation at low temperature, for example, at a temperature less than about 120° C., from the use of fractionated novolac resin. Thus in an embodiment, the patterned photoresist does not exhibit crack formation at a processing temperature of less than about 120° C. or in the presence of an etching solution.

The second additive may be prepared by copolymerization of an unsaturated carboxylic acid and a radical polymerizing compound (i.e., a comonomer). Examples of the unsaturated carboxylic acids include methacrylic acid, acrylic acid, itaconic acid, maleic acid, and the like. Combinations of these unsaturated carboxylic acids may be used. Examples of the radical polymerizing compound may include methyl(meth)acrylate, ethyl(meth)acrylate, propyl(meth)acrylate, n-butyl(meth)acrylate, pentyl(meth)acrylate, benzyl(meth)acrylate, 2-methoxyethyl(meth)acrylate, methoxytriethyleneglycol(meth)acrylate, 3-methoxybutyl(meth)acrylate, ethylcarbitol(meth)acrylate, phenoxypolyethyleneglycol(meth)acrylate, and the like. These radical polymerizing compounds may be used alone or in a combination thereof.

When the content of the second additive is less than about 0.1% by weight of the total weight of the photoresist composition, cracks may form in the photoresist pattern during application of external heat and/or external chemical material. When the content of the second additive is more than about 10% by weight, the sensitivity of the photoresist composition may be reduced. Thus, the content of the second additive may be about 0.1% to about 10%, specifically about 0.5 to about 9% by weight based on the total weight of the photoresist composition.

When the weight average molecular weight of the second additive is less than about 5,000 g/mol, cracking may not be prevented. When a weight average molecular weight of the second additive is more than about 10,000 g/mol, the sensitivity of the photoresist composition may be reduced and the resolution may therefore decrease. Thus, a weight average molecular weight of the second additive may be about 5,000 to about 10,000 g/mol, specifically about 6,000 to about 9,000 g/mol.

(e) Organic Solvent

The organic solvents useful herein may include ethers, glycol ethers, ethylene glycol alkyl ether acetates, diethylene glycols, propylene glycol monoalkyl ethers, aromatic hydrocarbons, ketones, esters, and the like. These may be used each alone or in a combination thereof. Exemplary organic solvents may include ethyl lactate, 2-heptanone, cyclohexanone, anisole, propylene glycol methyl ether, propylene glycol ethyl ether, propylene glycol methyl ether acetate (PGMEA), diethylene glycol monomethyl ether, diethylene glycol monomethyl ether acetate, dipropylene glycol monomethyl ether, dipropylene glycol monomethyl ether acetate, butyl acetate, pentyl acetate, ethoxyethylpropionate, or the like, and combinations thereof.

(f) Others

The photoresist composition may further include a surfactant, an adhesion promoter, and the like added to the alkali-soluble resin, the dissolution inhibitor, the first additive, the second additive and the organic solvent. Contents of the surfactant and the adhesion promoter may be determined depending on contents of the alkali-soluble resin, the dissolution inhibitor, the first additive and the second additive. However, a content of each of the surfactant and the adhesion promoter may be preferably about 0% to about 1% by weight so as not to affect reactions of the alkali-soluble resin, the dissolution inhibitor, the first additive and the second additive.

The surfactant may improve a coating ability or a developing ability of a photoresist composition. Examples of the surfactant may include poly oxyethyleneothylphenyl ether, poly oxyethylenenonylphenyl ether; surfactants marketed under the trade names F171, F172, and F173 by DAI NIPPON INK; fluorinated surfactants marketed under the tradenames FC430 and FC431 by SUMITOMO 3M; KP341 surfactant available from SINWOL CHEMICAL INDUSTRY, and the like. These surfactants may be used alone or in a combination thereof.

The adhesion promoter may improve adhesion between a photoresist pattern and a lower layer. Examples of the adhesion promoter may include a silane coupling agent having a reactive substitution group such as a carboxylic group, a methacrylic group, an isocyanate group, and an epoxy group. Examples of a silane coupling agent may include gamma-methacryloxypropyltrimethoxysilane, vinyltriacetoxysilane, vinyltrimethoxysilane, gamma-isocyanatopropyltriethoxysilane, beta-3,4-epoxy cyclo hexylethyltrimethoxysilane, and the like. These adhesion promoters may be used alone or in a combination thereof.

The viscosity of the photoresist composition may be about 3 cP (centipoise) to about 15 cP. The photoresist composition may patterned. In an embodiment, a method of forming a pattern using the photoresist composition may include forming a photoresist film on a substrate to be patterned from the photoresist composition, exposing the photoresist film with an actinic radiation, such as, for example, UV radiation including g-line, i-line, or other radiation, developing the exposed photoresist film to form a patterned photoresist, and etching the substrate to form a pattern. The developer may desirably be an aqueous basic developer. By use of the photoresist composition disclosed herein, the patterned photoresist prepared from the photoresist composition does not exhibit crack formation at a processing temperature of less than about 120° C. or in the presence of an etching solution.

Hereinafter, the photoresist composition and use thereof will be described with reference to specific examples and comparative examples.

Example 1

(a-1) About 12% by weight of a first fractionated novolac resin having a weight average molecular weight of about 20,000 g/mol and prepared by reacting a phenol mixture including m-cresol and p-cresol in a weight ratio of about 60:40 with formaldehyde and fractionating an obtained product by, (a-2) about 8% by weight of a second fractionated novolac resin having a weight average molecular weight of about 20,000 g/mol and prepared by reacting a phenol mixture including m-cresol and p-cresol in a weight ratio of about 50:50 with formaldehyde and fractionating an obtained product by, (b) about 7% by weight of a quinone diazide compound prepared by reacting 2,6-bis[4-hydroxy-3-(2-hydroxy-5-methylbenzyl)-2,5-dimethylbenzyl]-4-methylphenol with 1,2-naphthoquinonediazide-5-sulfonic acid chloride in a mole ratio of about 1:2.2, (c) about 0.5% by weight of 1,3-dihydrobenzene, (d) about 0.5% by weight of SPCY-series polymer (trade name, SHOWA POLYMER) having a weight average molecular weight of about 8,000 as an acrylic copolymer, (e) about 36.5% by weight of propylene glycol methyl ether acetate (PGMEA) as an organic solvent and about 35.5% by weight of ethyl lactate (EL) were mixed, and filtered through a fluorine resin filter to prepare a photoresist composition having a viscosity of about 15 cP. A glass transition temperature of the first and second fractionated novolac resins was about 120° C.

Example 2

(a-1) About 12% by weight of a first fractionated novolac resin having a weight average molecular weight of about 20,000 g/mol and prepared by reacting a phenol mixture including m-cresol and p-cresol in a weight ratio of about 60:40 with formaldehyde and fractionating an obtained product by, (a-2) about 8% by weight of a second fractionated novolac resin having a weight average molecular weight of about 20,000 g/mol and prepared by reacting a phenol mixture including m-cresol and p-cresol in a weight ratio of about 50:50 with formaldehyde and fractionating an obtained product by, (b) about 7% by weight of a quinone diazide compound prepared by reacting 2,6-bis[4-hydroxy-3-(2-hydroxy-5-methylbenzyl)-2,5-dimethylbenzyl]-4-methylphenol with 1,2-naphthoquinonediazide-5-sulfonic acid chloride in a mole ratio of about 1:2.2, (c) about 0.5% by weight of 1,2,3-trihydrobenzene pyrogallic acid, (d) about 0.5% by weight of SPCY-series polymer (trade name, SHOWA POLYMER) having a weight average molecular weight of about 8,000 as an acrylic copolymer, (e) about 36.5% by weight of propylene glycol methyl ether acetate (PGMEA) as an organic solvent and about 35.5% by weight of ethyl lactate (EL) were mixed, and filtered through a fluorine resin filter to prepare a photoresist composition having a viscosity of about 15 cP. A glass transition temperature of the first and second fractionated novolac resins was about 120° C.

Comparative Examples 1 to 6

Comparative photoresist compositions of Comparative Examples 1 to 6 were prepared according to the following Table 1.

TABLE 1

|  | Resin (content) | Dissolution inhibitor (content) | First additive (content) | Second additive (content) | Solvent (content) |
| --- | --- | --- | --- | --- | --- |
| Comparative Example 1 | A-1/A-2 (12/8) | B (7) | — | — | E/F(36.5/36.5) |
| Comparative Example 2 | A-1/A-2 (12/8) | B (7) | C-1 (0.5) | — | E/F(36.3/36.2) |
| Comparative Example 3 | A-1/A-2 (12/8) | B (7) | C-2 (0.5) | — | E/F(36.3/36.2) |

TABLE 1-continued

|  | Resin (content) | Dissolution inhibitor (content) | First additive (content) | Second additive (content) | Solvent (content) |
|---|---|---|---|---|---|
| Comparative Example 4 | A-1/A-2 (12/8) | B (7) | — | D-1 (0.5) | E/F(36.3/36.2) |
| Comparative Example 5 | A-1/A-2 (12/8) | B (7) | — | D-2 (0.5) | E/F(36.3/36.2) |
| Comparative Example 6 | A-3/A-4 (12/8) | B (7) | — | — | E/F(36.5/36.5) |

A-1: a first fractionated novolac resin having a weight average molecular weight of about 20,000 g/mol and a glass transition temperature of about 120° C., and prepared by reacting a phenol mixture including m-cresol and p-cresol in a weight ratio of about 60:40 with formaldehyde and fractionating an obtained product by;

A-2: a second fractionated novolac resin having a weight average molecular weight of about 20,000 and a glass transition temperature of about 120° C., and prepared by reacting a phenol mixture including m-cresol and p-cresol in a weight ratio of about 50:50 with formaldehyde and fractionating an obtained product by;

A-3: a third fractionated novolac resin having a weight average molecular weight of about 16,000 and a glass transition temperature of about 100° C., and prepared by reacting a phenol mixture including m-cresol and p-cresol in a weight ratio of about 60:40 with formaldehyde and fractionating an obtained product by;

A-4: a fourth fractionated novolac resin having a weight average molecular weight of about 15,000 and a glass transition temperature of about 100° C., and prepared by reacting a phenol mixture including m-cresol and p-cresol in a weight ratio of about 50:50 with formaldehyde and fractionating an obtained product by;

B: a quinone diazide compound prepared by reacting 2,6-bis[4-hydroxy-3-(2-hydroxy-5-methylbenzyl)-2,5-dimethylbenzyl]-4-methylphenol with 1,2-naphthoquinonediazide-5-sulfonic acid chloride in a mole ratio of about 1:2.2;

C-1: 1,3-hydrobenzene;

C-2: 1,2,3-trihydrobenzene pyrogallic acid;

D-1: SPCY-series polymer (trade name, SHOWA POLYMER) having a weight average molecular weight of about 8,000 g/mol as an acrylic copolymer;

D-2: SPCY-series polymer (trade name, SHOWA POLYMER) having a weight average molecular weight of about 20,000 g/mol as an acrylic copolymer;

E: propylene glycol methyl ether acetate (PGMEA); and

F: ethyl lactate (EL).

Forming a Photoresist Pattern

Each of photoresist compositions of Examples 1 and 2 and Comparative Examples 1 to 6 was spin-coated on a silicon wafer treated with hexamethyldisilazane, and pre-baked on a hot plate at a temperature of about 90° C. for about 60 seconds to form a photoresist film having a thickness of about 1.50 μm. The silicon wafer having the photoresist film was exposed to light using an NSR-2005 i9C i-Line stepper (Nikon Co. Ltd., NA=0.57, σ=0.60), at incrementally different exposure doses. Thereafter, the exposed photoresist film was heated at a temperature of about 110° C. for about 60 seconds, and then developed by tetramethylammonium hydroxide having a concentration of about 2.38 wt % for about 60 seconds to form a photoresist pattern.

Evaluation of a Photoresist Pattern (1) Evaluation of Crack Resistance

T-01 stripper (trade name, DONGWOO FINECHEM, Korea) was applied to the photoresist pattern formed from each of the photoresist compositions of Examples 1 and 2 and Comparative Examples 1 to 6, and crack formation on the surface of the photoresist pattern was observed. The results obtained are represented by "Very good" (⊚), "Good" (○), "Normal" (Δ) and "Poor" (x) in the following Table 2.

(2) Evaluation of Stripping

PRS-2000 stripper (DONGWOO FINECHEM, Korea) was applied to the photoresist pattern formed from each of the photoresist compositions of Examples 1 and 2 and Comparative Examples 1 to 6 to strip the photoresist pattern, and a surface of the silicon wafer was observed. The results obtained are represented by "Very good" (⊚), "Good" (○), "Normal" (Δ) and "Poor" (x) in the following Table 2.

(3) Evaluation of Heat Resistance

The photoresist pattern formed from each of the photoresist compositions of Examples 1 and 2 and Comparative Examples 1 to 6 to strip the photoresist pattern was heated at a temperature of about 150° C. for about 150 seconds, and the profile of the photoresist pattern was observed by a scanning electron microscopy ("SEM"). The results obtained are represented by "No deformation" (⊚), "Small deformation" (○), "Normal deformation" (Δ) and "Large deformation" (x) in the following Table 2.

TABLE 2

|  | Crack resistance | Stripping | Heat resistance |
|---|---|---|---|
| Example 1 | ○ | ○ | ⊚ |
| Example 2 | ○ | ○ | ⊚ |
| Comparative Example 1 | X | X | ⊚ |
| Comparative Example 2 | X | ○ | ⊚ |
| Comparative Example 3 | X | ○ | ⊚ |
| Comparative Example 4 | ○ | X | ⊚ |
| Comparative Example 5 | X | X | ⊚ |
| Comparative Example 6 | ○ | ○ | X |

Referring to Table 2, it can be noted that the photoresist patterns formed from the photoresist compositions according to Examples 1 and 2 have relatively better crack-resistance and stripping ability when compared to the photoresist pattern formed from the photoresist compositions according to Comparative Examples 1 to 6. Furthermore, it can be seen that the photoresist patterns formed from the photoresist compositions according to Examples 1 and 2 are not deformed at a temperature of about 150° C. because the photoresist compositions include fractionated novolac resins having a glass transition temperature of about 120° C.

Method of Manufacturing a Display Substrate

Hereinafter, a method of manufacturing a display substrate according to an exemplary embodiment of the present invention will be described with reference to FIGS. 1 to 7.

Referring to FIG. 1, a gate metal layer and a first photoresist pattern 210 are formed on a surface of base substrate 110.

The gate metal layer is patterned by using the first photoresist pattern 210 as an etching mask to form a gate pattern including a gate line 121 and a gate electrode 123, which as illustrated are features forming opposite ends of the same gate metal layer after patterning. The gate metal layer may have a double-layered structure including an aluminum layer and a molybdenum layer (not shown).

Figure 2:
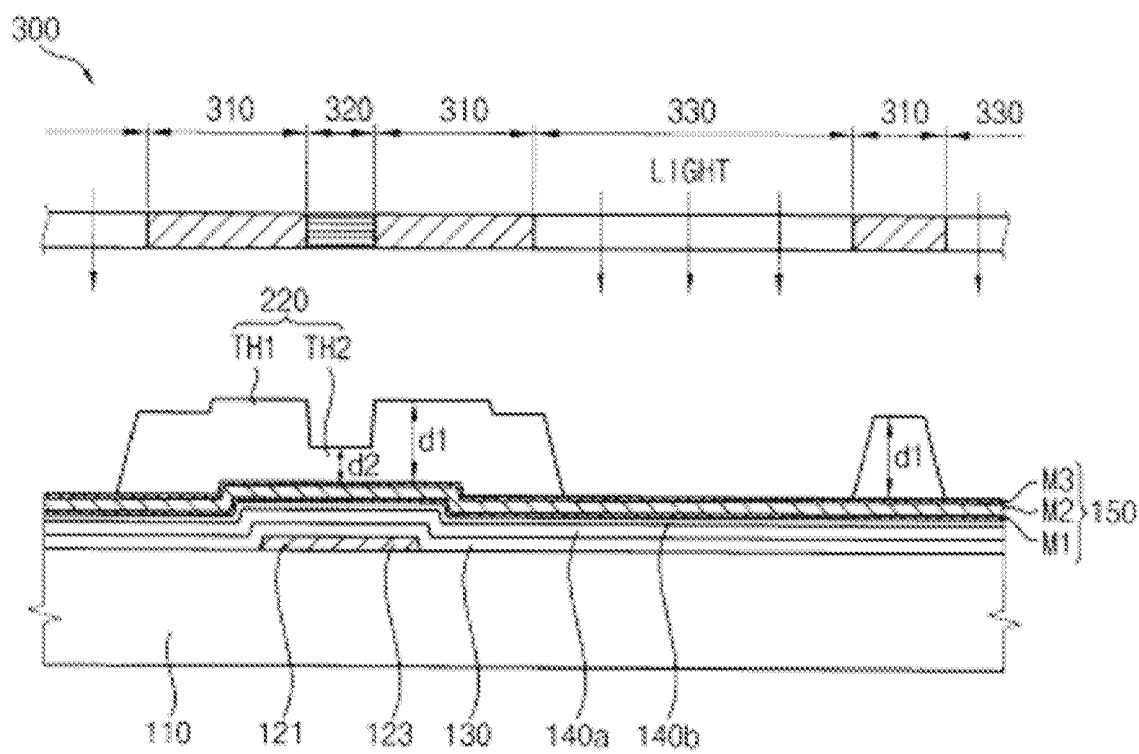
FIG. 2 is a cross-sectional view illustrating an exemplary display device.

Referring to FIG. 2, a gate insulation layer 130 is formed on a surface of the base substrate 110, a semiconductor layer 140a is formed on a surface of gate insulation layer 130 opposite base substrate 110, an ohmic contact layer 140b is formed on a surface of semiconductor layer 140a opposite gate insulation layer 130, and a source metal layer 150 is formed on a surface of ohmic contact layer 140b opposite semiconductor layer 140a. In this way, each layer is formed sequentially perpendicular to the plane of and on the surface of the base substrate 110 having the gate pattern to form a multilayer stack. The source metal layer 150 may have a triple-layered structure including a first metal layer M1 including molybdenum, a second metal layer M2 including aluminum and a third metal layer M3 including molybdenum.

A second photoresist pattern 220 is formed on the base substrate 110 having the source metal pattern 150. For example, a positive-type photoresist composition including about 10% to about 25% by weight of an alkali-soluble resin, about 1% to about 10% by weight of a dissolution inhibitor including a quinone diazide compound, about 0.1% to about 10% by weight of a first additive including a benzenol compound represented by the following Chemical Formula 1, about 0.1% to about 10% by weight of a second additive including an acrylic copolymer represented by the following Chemical Formula 2 and a balance of an organic solvent is coated on the surface of a source metal pattern on the surface of base substrate 110 to form a photoresist film. The photoresist film is exposed to light through a mask 200, and then developed to form the second photoresist pattern 220.

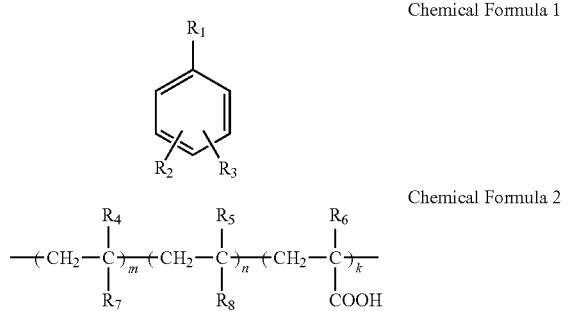

Chemical Formula 1

Chemical Formula 2

In Chemical Formula 1, $R_1$, $R_2$ and $R_3$ independently represent a hydrogen atom, an alkyl group having 1 to 10 carbon atoms, or an alkyl hydroxyl group having 1 to 10 carbon atoms, and at least one of $R_1$, $R_2$ and $R_3$ represents a hydroxyl group. In Chemical Formula 2, $R_4$, $R_5$ and $R_6$ each independently represent a hydrogen atom or an alkyl group having 1 to 3 carbon atoms, $R_7$ represents a hydrocarbon having 1 to 6 carbon atoms, of which at least one hydrogen atom is replaceable by a substituent, $R_8$ represents a benzyl group or a phenyl group, and m, n, and k independently represent an integer of 1 to 99 such that the sum of m, n and k is 100. The hydrogen atom of the hydrocarbon maybe replaceable with an alkyl group, a hydroxyalkyl group, an alkoxy group, or a cycloalkyl group having 3 to 6 carbon atoms.

The mask 200, shown in FIG. 2, includes a light-blocking portion 310, a half-light-transmitting portion 320 and a light-transmitting portion 330. The photoresist film corresponding to the light-blocking portion 310 is not removed by a developing solution, and has a first thickness d1 on the source metal layer 150. The first thickness d1 may be substantially the same as an initial thickness of the photoresist film. As used herein, "substantially the same" with respect to photoresist film thickness means having a thickness, after developing, that is similar to and comparable with that of the photoresist film before developing, differing only in ordinary thickness loss intrinsic to the photoresist film. The photoresist film corresponding to the half-light-transmitting portion 320 is partially removed by the developing solution so that a portion of the photoresist film corresponding to the half-light-transmitting portion 320 has a second thickness d2 on the source metal layer 150. The second thickness d2 is smaller than the first thickness d1. The portion of the photoresist film corresponding to and exposed through the light-transmitting portion 330 of mask 300 is fully removed by the developing solution to expose a corresponding portion of source metal layer 150. As a result, the second photoresist pattern 220 is formed to have a first thickness portion TH1 having the first thickness d1 and a second thickness portion TH2 having the second thickness d2. The first thickness portion TH1 is disposed where a source pattern is formed through a following process. The photoresist composition has a high photosensitivity. Thus, the first thickness portion TH1 and the second thickness portion TH2 may be stably formed.

The base substrate 110 having the second photoresist pattern 220 may be heated after the second photoresist pattern 220 is formed. As a result, adhesion between the second photoresist pattern 220 and the source metal layer 150 may be enhanced. The base substrate 110 may be heated at a temperature of about 140° C. to about 150° C. The second photoresist pattern 220 formed from the photoresist composition is not deformed while the second photoresist pattern 220 is heated. Furthermore, an angle θ formed by an upper surface of the base substrate 110 and a side surface of the second photoresist pattern 220 is not substantially changed when compared to an initial angle after the second photoresist pattern 220 is heated. For example, difference of the angle θ between before and after performing the heating process may be about 0° to about 15°, specifically about 5° to about 10°. Thus, the shape of the second photoresist pattern 220 after heating may be, in this way, substantially the same as a shape of the second photoresist pattern 220 before heating.

Figure 3:
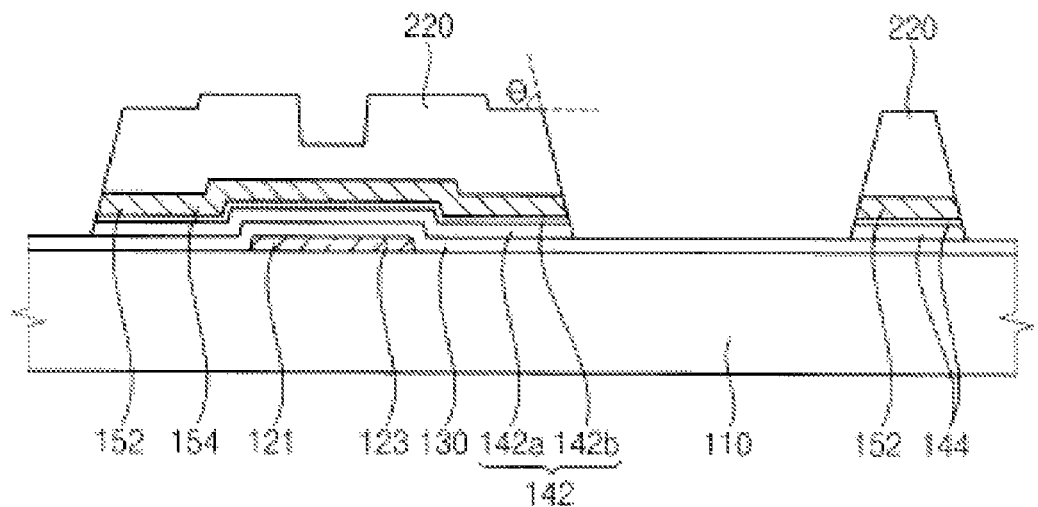
FIGS. 3, 4 and 5 are cross-sectional views illustrating a method of manufacturing the exemplary display device illustrated in FIG. 2.

The source metal layer 150 is then etched by using the second photoresist pattern 220 as an etching mask as shown in FIG. 3. Thereafter, the exposed ohmic contact layer 140b and the semiconductor layer 140a are also etched to expose gate insulation layer 130. For example, the source metal layer 150 may be etched by using an integral etching solution capable of etching all of the first, second and third metal layers M1, M2 and M3. The integral etching solution may include nitric acid. A crack is not formed at the second photoresist pattern 220 even where the integral etching solution is used. Furthermore, a shape of a side surface of the second photoresist pattern 220 may be substantially the same as a shape of an etched surface of the source metal layer 150.

Hereinafter, the source metal layer 150 having a triple-layered structure illustrated in FIGS. 3 to 7 will be described as a single layer for ease of description.

Referring to FIG. 3, the source metal layer 150 is patterned so that a data line 152 and a provisional electrode pattern 154 connected to the data line 152 are formed on the base substrate 110. The data line 152 crosses the gate line 121, and the provisional electrode pattern 154 is disposed on the gate electrode 123 to overlap with the gate electrode 123.

Thereafter, the ohmic contact layer 140b and the semiconductor layer 140a are etched using the provisional electrode pattern 154 and the second photoresist pattern 220 as an etching mask. Thus, a provisional active pattern 142 is formed under the data line 152, and a line pattern (not shown) is formed under the data line 152. The provisional active pattern 142 includes a semiconductor pattern 142a and an ohmic contact pattern 142b.

Figure 4:
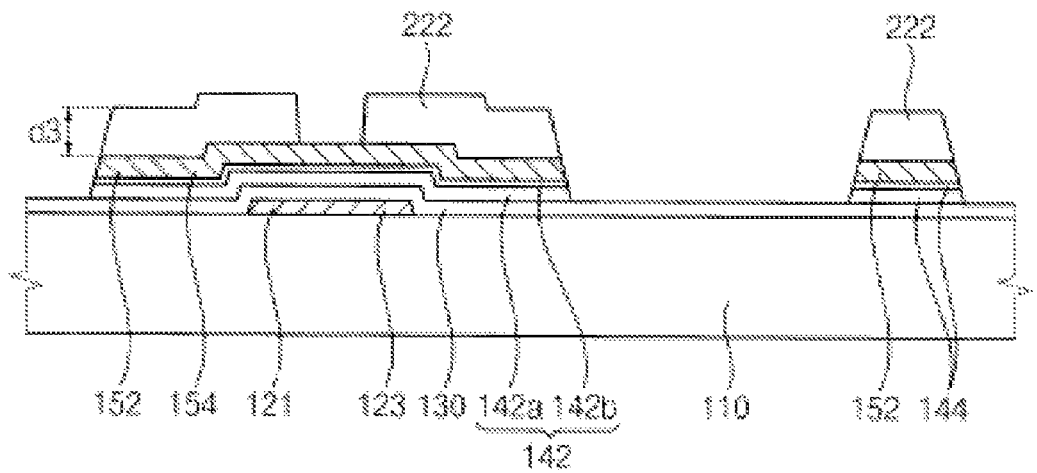

Referring to FIG. 4, the second thickness portion TH2 of the second photoresist pattern 220 is removed to form a remaining pattern 222. The second photoresist pattern 220 is removed by the second thickness d2 so that the first thickness portion TH1 forms the remaining pattern 222 having a third thickness d3. The provisional electrode pattern 154 is partially exposed through the remaining pattern 222.

Figure 5:
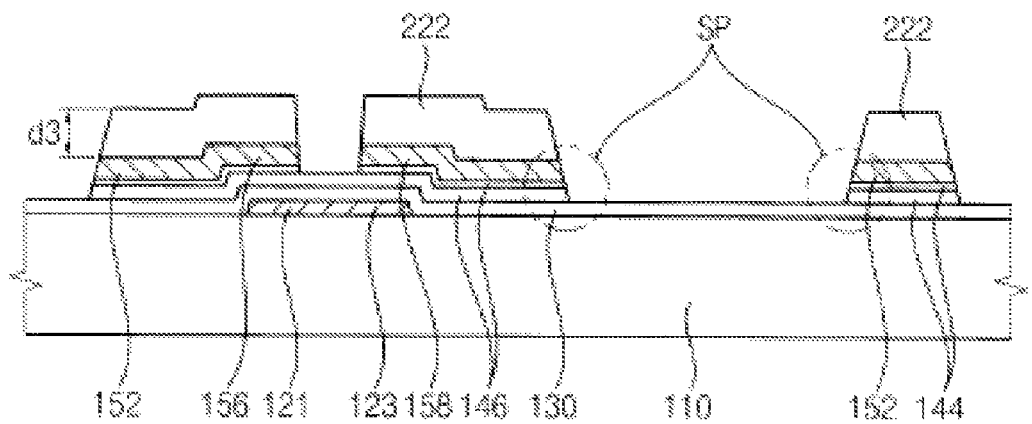

Referring to FIG. 5, a portion of the provisional electrode pattern 154 is removed by using the remaining pattern 222 as an etching mask to form a source electrode 156 connected to the date line 152 and a drain electrode 158 spaced apart from the source electrode 156. Thus, a source pattern including the data line 152, the source electrode 154 (each shown as occupying the same layer) and the drain electrode 156 is formed on the base substrate 110.

The provisional electrode pattern for source electrode 154 may be patterned by the integral etching solution. The remaining pattern 222 formed from the photoresist composition is hardly stressed internally or externally by the integral etching solution. In this way, cracks are not formed in the remaining pattern 222.

Thereafter, the ohmic contact pattern 142b of the provisional active pattern 142, which is exposed between the source electrode 156 and the drain electrode 158, is removed. Accordingly, an active pattern 146 including the semiconductor pattern 142a, of which a portion is exposed between the source electrode 156 and the drain electrode 158, is formed.

The remaining pattern 222 does not deform, and does not exhibit crack formation even if the processes illustrated in FIGS. 4 and 5 are performed. Thus, the shape of an etched surface of the source electrode 156 and the drain electrode 158 may be substantially the same as that of the active pattern 146, as a region "SP" illustrated in FIG. 5 (encircled portion). Thus, the active pattern 146 does not protrude relative to the source electrode 156 and the drain electrode 158 in a lateral direction. Furthermore, the etched surfaces of the data line 152 and the line pattern 144 may be substantially the same as each other.

Figure 6:
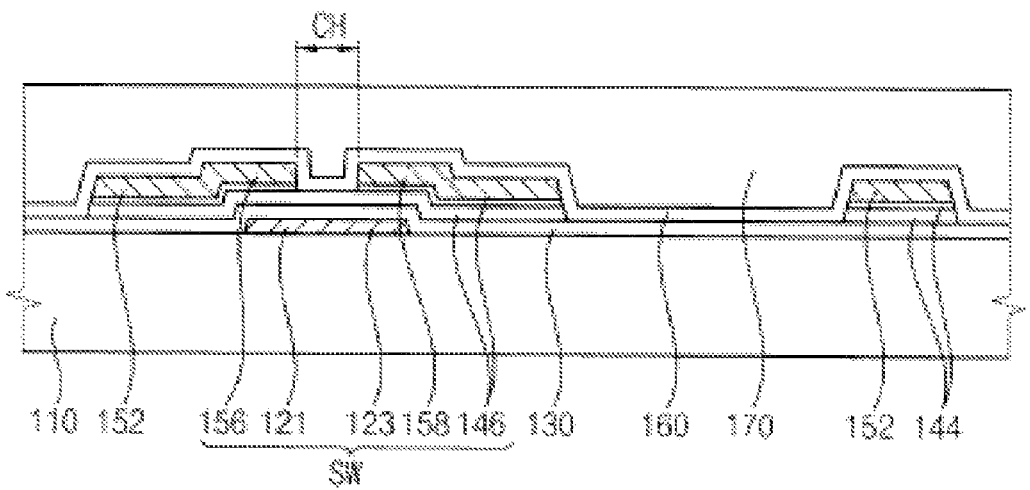
FIG. 6 is a cross-sectional view illustrating a display device according to another exemplary embodiment.

Referring to FIG. 6, the remaining pattern 222 is removed by a stripping solution. The remaining pattern 222, which has a high heat resistance, may be readily stripped. Thus, the reliability of a process for forming the source pattern may be improved.

A passivation layer 160 and a planarizing layer 170 are each formed sequentially on and overlaying the base substrate having a thin-film transistor SW including the gate electrode 123, the active pattern having a channel portion CH, the source electrode 156 and the drain electrode 158.

Figure 7:
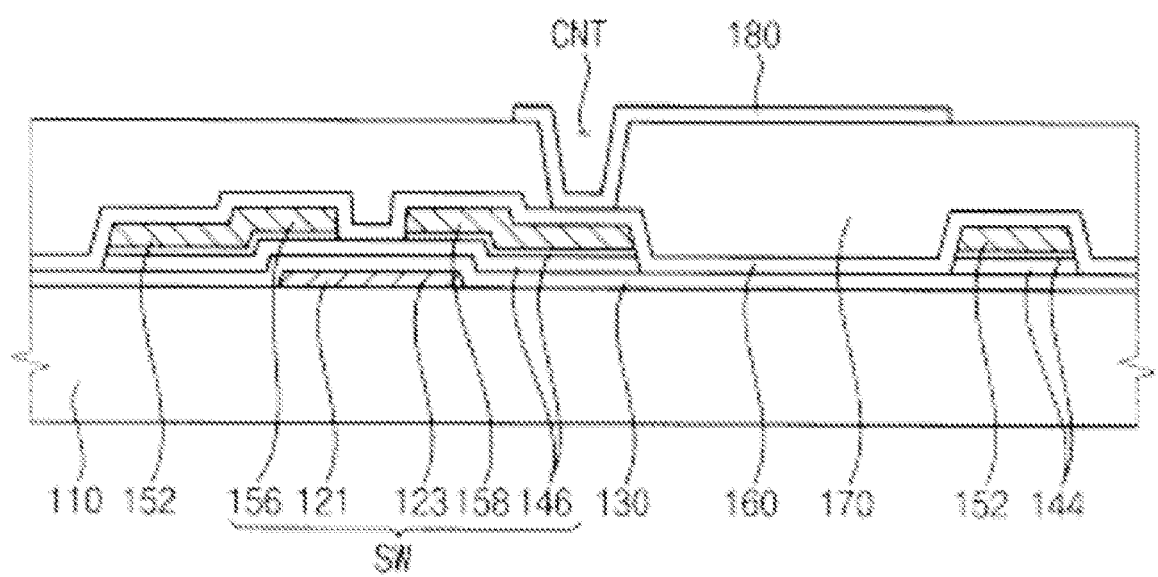
FIG. 7 is a cross-sectional view illustrating a display device according to still another exemplary embodiment.

Referring to FIG. 7, the passivation layer 160 and the planarizing layer 170 are patterned to form a contact hole CNT exposing an end of the drain electrode 158. In an embodiment (not shown), the planarizing layer 170 may be omitted.

Thereafter, an electrode layer is formed on the base substrate 110 having the contact hole CNT, and patterned to form a pixel electrode 180. The pixel electrode 180 makes contact with the drain electrode 158 through the contact hole CNT to be electrically connected to the thin-film transistor SW.

In the exemplary embodiments, a process for forming the contact hole CNT and a process for patterning the electrode layer are performed separately, however, the process for forming the contact hole CNT and the process for patterning the electrode layer may be performed by using the same mask.

According to exemplary embodiments, heat resistance of a photoresist pattern may be improved, and the photoresist pattern may be readily stripped, by use of the photoresist composition disclosed herein. Furthermore, crack formation in the photoresist pattern prepared using the photoresist composition may be reduced and/or prevented. Thus, an active pattern is prevented from protruding relative to an adjacent source pattern in a method of manufacturing a thin-film transistor. The method of manufacturing the thin-film transistor includes forming the active pattern and the source pattern by using one same mask.

Although the exemplary embodiments have been described, it is understood that the present invention should not be limited to these exemplary embodiments but various changes and modifications can be made by one ordinary skilled in the art within the spirit and scope of the invention as hereinafter claimed.

What is claimed is:

1. A photoresist composition comprising:
   an alkali-soluble resin;
   a dissolution inhibitor including a quinone diazide compound;
   a first additive including a benzenol compound represented by the following Chemical Formula 1;
   a second additive including an acrylic copolymer represented by the following Chemical Formula 2; and
   an organic solvent,

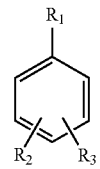

Chemical Formula 1

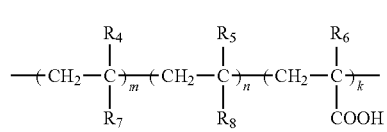

Chemical Formula 2 wherein, $R_1$, $R_2$ and $R_3$ each independently represent a hydrogen atom, an alkyl group having 1 to 10 carbon atoms, or a hydroxyalkyl group having 1 to 10 carbon atoms, and at least one of $R_1$, $R_2$ and $R_3$ represents a hydroxy group, $R_4$, $R_5$ and $R_6$ each independently represent a hydrogen atom or an alkyl group having 1 to 3 carbon atoms, $R_7$ represents a hydrocarbon having 1 to 6 carbon atoms, of which at least one hydrogen atom is replaceable, $R_8$ represents a substituted or unsubstituted benzyl group or phenyl group, and m, n, and k are each independently an integer of 1 to 99 wherein the sum of m, n and k is 100.

2. The photoresist composition of claim 1, wherein the alkali-soluble resin comprises a fractionated novolac resin.

3. The photoresist composition of claim 2, wherein a glass transition temperature of the fractionated novolac resin is about 120° C. to about 150° C.

4. The photoresist composition of claim 2, wherein a weight average molecular weight of the fractionated novolac resin is about 20,000 to about 30,000 g/mol.

5. The photoresist composition of claim 1, wherein the dissolution inhibitor includes a sulfonic acid ester compound prepared by reaction of a phenol compound having at least one hydroxy group and a quinone diazide sulfonic acid halide compound.

6. The photoresist composition of claim 1, wherein a weight average molecular weight of the second additive is about 5,000 to about 10,000 g/mol.

7. The photoresist composition of claim 1, wherein the second additive is prepared by copolymerizing an unsaturated carboxylic acid with at least one selected from the group consisting of methyl(meth)acrylate, ethyl(meth)acrylate, propyl(meth)acrylate, n-butyl(meth)acrylate, pentyl(meth) acrylate, benzyl(meth)acrylate, 2-methoxyethyl(meth)acrylate, methoxytriethyleneglycol(meth) acrylate, 3-methoxybutyl(meth)acrylate, ethylcarbitol(meth) acrylate, and phenoxypolyethyleneglycol(meth)acrylate.

8. The photoresist composition of claim 1, wherein the alkali-soluble resin comprises:
a first fractionated novolac resin prepared from a phenol mixture including m-cresol and p-cresol in a weight ratio of about 60:40; and
a second fractionated novolac resin prepared from a phenol mixture including m-cresol and p-cresol in a weight ratio of about 50:50.

9. The photoresist composition of claim 1, comprising about 10% to about 25% by weight of the alkali-soluble resin, about 1% to about 10% by weight of the dissolution inhibitor, about 0.1% to about 10% by weight of the first additive, about 0.1% to about 10% by weight of the second additive and a balance of the organic solvent.

10. A method of manufacturing a display substrate, the method comprising:
forming a gate pattern on a surface of a base substrate, the gate pattern including a gate line and a gate electrode;
sequentially forming a gate insulation layer, a semiconductor layer, an ohmic contact layer and a source metal layer on the base substrate having the gate pattern to form a multilayer stack;
coating a photoresist composition on the base substrate having the source metal layer to form a photoresist pattern, the photoresist composition including an alkali-soluble resin, a dissolution inhibitor including a quinone diazide compound, a first additive including a benzenol compound represented by the following Chemical Formula 1, a second additive including an acrylic copolymer represented by the following Chemical Formula 2 and an organic solvent;
patterning the source metal layer having the photoresist pattern as an etching mask to form a source pattern and an active pattern, the source pattern including a data line, a source electrode and a drain electrode, the active pattern being formed between the source and drain electrodes and the base substrate; and
forming a pixel electrode electrically connected to the drain electrode on the base substrate having the source pattern and the active pattern,

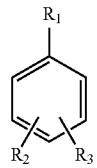

Chemical Formula 1

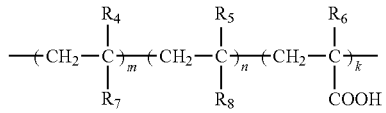

Chemical Formula 2 wherein, $R_1$, $R_2$ and $R_3$ each independently represent a hydrogen atom, an alkyl group having 1 to 10 carbon atoms, or a hydroxyalkyl group having 1 to 10 carbon atoms, wherein at least one of $R_1$, $R_2$ and $R_3$ represents a hydroxy group, $R_4$, $R_5$ and $R_6$ each independently represent a hydrogen atom or an alkyl group having 1 to 3 carbon atoms, $R_7$ represents a hydrocarbon having 1 to 6 carbon atoms, of which at least one hydrogen atom is replaceable, $R_8$ represents a benzyl group or a phenyl group, and m, n, and k are each independently an integer of 1 to 99 wherein the sum of m, n and k is 100.

11. The method of claim 10, wherein the photoresist composition comprises about 10% to about 25% by weight of the alkali-soluble resin, about 1% to about 10% by weight of the dissolution inhibitor, about 0.1% to about 10% by weight of the first additive, about 0.1% to about 10% by weight of the second additive and a balance of the organic solvent.

12. The method of claim 11, wherein the photoresist pattern includes a first thickness portion having a first thickness and overlapping with the source pattern, and a second thickness portion having a second thickness smaller the first thickness and overlapping with a gap between the source electrode and the drain electrode.

13. The method of claim 12, wherein forming the source pattern comprises:
etching the source metal layer, the ohmic contact layer and a semiconductor layer by using the photoresist pattern as an etching mask;
removing the second thickness portion of the photoresist pattern;
removing an exposed portion of the source metal layer to form the source electrode and the drain electrode; and
forming the active pattern by using the source electrode and the drain electrode as an etch mask.

14. The method of claim 10, wherein forming the source pattern comprises:
etching the ohmic contact layer and a semiconductor layer to form a line pattern disposed between the data line and the base substrate.

15. The method of claim 10, wherein the source metal layer comprises a first metal layer including molybdenum, a second metal layer including aluminum and a third metal layer including molybdenum.

16. The method of claim 15, wherein the first, second and third metal layers of the source metal layer are each etched by an etching solution including nitric acid.

17. The method of claim 10, wherein forming the photoresist pattern comprises:
heating the photoresist pattern at a temperature of about 140° C. to about 150° C.

18. The method of claim 17, wherein a shape of the photoresist pattern before heating is substantially the same as a shape of the photoresist pattern after heating.

19. A display substrate prepared by the method of claim 1.

20. A method of forming a pattern comprising:

forming a photoresist film on a substrate from a photoresist composition comprising:

an alkali-soluble resin comprising a fractionated novolac resin, wherein a glass transition temperature of the fractionated novolac resin is about 120° C. to about 150° C.;

a dissolution inhibitor including a quinone diazide compound;

a first additive including a benzenol compound represented by the following Chemical Formula 1;

a second additive including an acrylic copolymer represented by the following Chemical Formula 2; and an organic solvent, exposing the photoresist film with i-line radiation, developing the exposed photoresist film to form a patterned photoresist, and etching the substrate to form a pattern, wherein the patterned photoresist does not exhibit crack formation at a processing temperature of less than about 120° C. or in the presence of an etching solution, Chemical Formula 1

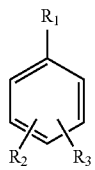

Chemical Formula 2

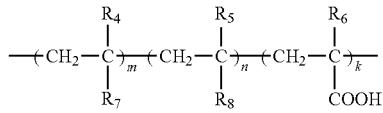

wherein, $R_1$, $R_2$ and $R_3$ each independently represent a hydrogen atom, an alkyl group having 1 to 10 carbon atoms, or a hydroxyalkyl group having 1 to 10 carbon atoms, and at least one of $R_1$, $R_2$ and $R_3$ represents a hydroxy group, $R_4$, $R_5$ and $R_6$ each independently represent a hydrogen atom or an alkyl group having 1 to 3 carbon atoms, $R_7$ represents a hydrocarbon having 1 to 6 carbon atoms, of which at least one hydrogen atom is replaceable, $R_8$ represents a substituted or unsubstituted benzyl group or phenyl group, and m, n, and k are each independently an integer of 1 to 99 wherein the sum of m, n and k is 100.

* * * * *